(12) United States Patent
Harnik et al.

(10) Patent No.: US 6,313,443 B1
(45) Date of Patent: *Nov. 6, 2001

(54) APPARATUS FOR PROCESSING MATERIAL AT CONTROLLED TEMPERATURES

(75) Inventors: Arie Harnik, Haifa; Elie Schwarzfuchs, Hosaya; Eliezer Iskevitch, Kiryat Motzkin, all of (IL)

(73) Assignee: Steag CVD Systems, Ltd., Migdal Ha'Emek (IL)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/294,149

(22) Filed: Apr. 20, 1999

(51) Int. Cl.[7] .................................................. A21B 1/00
(52) U.S. Cl. ...................... 219/405; 219/390; 118/724; 118/729; 392/416
(58) Field of Search .................................... 219/390, 405, 219/411; 118/724, 725, 728, 729, 730, 50.1; 392/416, 418

(56) References Cited

U.S. PATENT DOCUMENTS

| | | |
|---|---|---|
| 5,156,461 | 10/1992 | Moslehi et al. . |
| 5,255,286 | 10/1993 | Moslehi et al. . |
| 5,490,728 | 2/1996 | Schietinger et al. . |
| 5,830,277 | * 12/1999 | Johnsguard et al. ................ 118/725 |
| 6,007,241 | * 12/1999 | Yam et al. ........................... 374/131 |

FOREIGN PATENT DOCUMENTS 99 02952    1/1999    (JP) .

OTHER PUBLICATIONS

"Rapid Thermal Processing Science and Technology", by Fred Roozeboom, Academic Press, California (1993), pp. 349–423.

"Advances in Temperature Measurement and Control for RTP", by Peuse et al., 5th International Conference on Advanced Thermal Processing of Semiconductors RTP 1997, pp. 358–365.

"Optical Pyrometry in RTP/RTCVD Systems: A New Approach", by Glazman et al., 6th International Conference on Advanced Thermal Processing of Semiconductors—RTP '98, pp. 146–155.

* cited by examiner

*Primary Examiner*—Teresa Walberg
*Assistant Examiner*—Shawntina Fuqua
(74) *Attorney, Agent, or Firm*—Nixon & Vanderhye P.C.

(57) ABSTRACT

Semiconductor processing apparatus, including a chamber, into which a semiconductor wafer is introduced for processing thereof and a heater, which heats the wafer in the chamber. A radiation guide collects thermal radiation from a selected region of the wafer. A wafer support assembly supports the wafer and shields the radiation guide from radiation other than radiation from the region. A pyrometer, coupled to receive the radiation from the guide, analyzes the radiation to determine a temperature of the region, for use in controlling the processing.

14 Claims, 5 Drawing Sheets

APPARATUS FOR PROCESSING MATERIAL AT CONTROLLED TEMPERATURES

FIELD OF THE INVENTION

The present invention relates generally to apparatus for thermal processing of materials, and specifically for processing semiconducting wafers at variable temperatures.

BACKGROUND OF THE INVENTION

Thermal processing of semiconducting wafers, such as silicon wafers, to produce semiconductor devices is well known in the art. The processing typically comprises maintaining a wafer at a different, known temperatures for predetermined times. During the processing, it is necessary to know the temperature of the wafer to a high accuracy in order to achieve repeatable results. Pyrometers, which measure temperature based on infrared emission and reflection from the wafer, are commonly used to monitor the temperature. Accurate pyrometric temperature measurement is dependent, however, on knowing the emissivity of the wafer, which varies with prior processing steps, temperature, and process steps performed while the measurement is being made.

Rapid Thermal Processing (RTP) is a state-of-the-art process used to manufacture semiconductor devices, wherein a wafer, or a region of a wafer, is cycled rapidly through a series of predetermined temperatures. Often rapid thermal processing is combined with chemical vapor deposition (RTCVD). Both processes rely on accurate, real-time determinations of the temperature of the region being processed. A review of RTP entitled *Rapid Thermal Processing Science and Technology* (ISBN 0-12-247690-5), Academic Press, California (1993), is herein incorporated by reference. Chapter 9 of the review indicates that processing efficiency is critically dependent on accurate temperature measurement of wafers during the processing.

In "Advances in Temperature Measurement and Control for RTP," by Peuse et al., *5th International Conference on Advanced Thermal Processing of Semiconductors—RTP 1997*, which is incorporated herein by reference, the authors describe processing of semiconductor wafers using an RTP system known as the Centura system, produced by Applied Materials Inc., of Santa Clara, Calif. The system relies on placing the wafer in a highly reflective enclosure, so as to eliminate as nearly as possible the effects of variations in emissivity of the wafer, whereby the total enclosure closely approximates a black body. (The theory of pyrometric temperature determination by analysis of radiation from an object requires that an emissivity or an effective emissivity of the object be known; a black body has an emissivity of unity.) U.S. Pat. No. 5,490,728, to Schietinger et al., which is incorporated herein by reference, describes a non-contact pyrometric technique for measuring characteristics, including temperature, of a substrate. The technique estimates the emissivity of a wafer by comparing the amplitude of ripple flux in radiation reflected from the wafer with an incoming ripple flux amplitude due to an AC-powered heating lamp.

U.S. Pat. No. 5,255,286, to Moslehi et al., which is incorporated herein by reference, describes a method of optical pyrometry based on irradiating a semiconductor wafer with monochromatic coherent radiation at a wavelength of the order of 5 $\mu$m. Intensities of reflected coherent radiation and emitted incoherent radiation from the wafer are used to determine a value of the emissivity and of the temperature of the wafer.

In "Optical Pyrometry in RTP/RTCVD Systems: A New Approach," by Glazman et al., *6th International Conference on Advanced Thermal Processing of Semiconductors—RTP'98*, which is incorporated herein by reference, the authors describe a technique for measurement of the temperature of a semiconducting wafer using optical pyrometry. The technique uses an active multi-spectral system to dynamically measure the true emissivity of the wafer. The measured emissivity is utilized together with measurements of radiation emitted by the wafer in order to evaluate the temperature of the wafer.

SUMMARY OF THE INVENTION

It is an object of some aspects of the present invention to provide methods and apparatus for improved thermal processing of materials.

It is a further object of some aspects of the present invention to provide methods and apparatus for improved temperature measurement of materials.

It is a further object of some aspects of the present invention to provide methods and apparatus for improved thermal processing of moving regions of materials.

In preferred embodiments of the present invention, an object to be thermally processed, typically a semiconducting wafer, is placed in a chamber wherein the object is heated to above the ambient temperature. The wafer is held within the chamber by a wafer support assembly, a section of which, generally opposite the wafer, is preferably cooled to a temperature substantially below that of the wafer. The wafer support assembly is constructed so that the assembly and a surface of the wafer together form a substantially closed cavity, so as to exclude therefrom radiation from sources other than the wafer surface.

The temperature of a region of the surface of the wafer is measured by collecting radiation from the region in a distal end of a radiation guide, preferably comprising a fiberoptic. The radiation guide preferably passes through and is thermally coupled to the cooled section of the assembly. The guide is shielded from radiation, other than radiation from the region, by the structure of the closed cavity. The radiation guide is radiatively coupled at its proximal end to a pyrometer, which determines the temperature of the region responsive to the collected thermal radiation. The shielding of the radiation guide from extraneous radiation and the reduction of thermal radiation entering the guide by virtue of cooling of the support structure substantially improve the accuracy of the temperature measurement of the particular region of the wafer at which the fiberoptic is directed. The ability to process the wafer at accurately known temperatures significantly improves the efficiency and speed of thermal processing, compared to methods and systems at present known in the art. Furthermore, thermally coupling the radiation guide to the cooled section of the assembly cools the distal portion of the guide, and thereby prolongs the life of the guide.

Preferably, the pyrometer measures the temperature of the region of the wafer based on a known emissivity of the region. Alternatively, the pyrometer is able to measure the temperature independently of prior knowledge of an emissivity of the region, as is described in the above-referenced patents and publications, for example, or as is otherwise known in the art. It is not necessary that the region be in thermal equilibrium with the chamber.

In some preferred embodiments of the present invention, the wafer undergoing thermal processing is mounted substantially horizontally inside a vacuum-tight chamber. The chamber comprises inlet and outlet tubing which are used to evacuate the chamber and to enable the ingress of gases used for the processing. Preferably, the wafer support assembly whereon the wafer is mounted is rotatable about a vertical axis, and rotates the wafer in the chamber in order to improve processing uniformity across the wafer. The chamber further comprises heaters, most preferably incandescent lamps positioned above the wafer, which are used to heat the wafer. The radiation guide, substantially transparent to radiation emitted from the heated wafer, is fixedly mounted generally along the axis of the wafer support assembly so as to rotate with the assembly and the wafer. An upper (distal) end of the rotating guide is positioned close to, but not touching, a region of the wafer whose temperature is to be measured, in order to collect thermal radiation from the region.

A lower (proximal) end of the rotating guide is optically coupled to a distal end of a fixed radiation guide, which is preferably aligned axially with the rotating guide. Most preferably, the diameter of the fixed guide is substantially equal to the diameter of the rotating guide, so that there is minimal loss when radiation transfers between the guides. The radiation collected by the upper end of the rotating guide is thus transferred to the fixed guide and is further transferred by the fixed guide to a radiation pyrometer, wherein a temperature of the region is evaluated responsive to measurements made on the radiation, by methods known in the art.

There is therefore provided, in accordance with a preferred embodiment of the present invention, semiconductor processing apparatus, including:

a chamber, into which a semiconductor wafer is introduced for processing thereof;

a heater, which heats the wafer in the chamber;

a radiation guide, which collects thermal radiation from a selected region of the wafer;

a wafer support assembly, which supports the wafer and shields the radiation guide from radiation other than radiation from the region; and a pyrometer, coupled to receive the radiation from the guide, and which analyzes the radiation to determine a temperature of the region, for use in controlling the processing.

Preferably, at least a portion of the wafer support assembly is cooled to a temperature substantially below the temperature of the region.

Preferably, a portion of the radiation guide in proximity to the wafer is in thermal communication with the cooled portion of the wafer support assembly.

Preferably, the wafer and the wafer support assembly form a cavity that is substantially closed against entry of extraneous radiation.

Alternatively, the wafer support assembly varies the position of the wafer and varies the position of the radiation guide in cooperation therewith.

Preferably, the apparatus includes a fixed radiation guide, which is coupled to the variably positioned radiation guide so as to transfer the radiation between the guide and the pyrometer.

Alternatively, the apparatus includes a connector coupling the fixed guide to the variably positioned guide in mutual axial alignment so as to enable radiation transfer therebetween.

Preferably, the radiation is transferred between the fixed and variably positioned guides substantially without optical elements intervening between the guides.

Preferably, the variably positioned guide rotates about a longitudinal axis common to the fixed and variably positioned guides.

Preferably, the pyrometer determines the temperature of the region substantially without prior knowledge of an emissivity of the region.

Alternatively, the pyrometer transmits radiation into the guide and measures a reflectance of the wafer responsive to the transmitted radiation, so as to estimate the emissivity of the wafer.

Preferably, the assembly includes a vertical drive mechanism, which drives the radiation guide to a position in proximity with the wafer.

Preferably, the assembly includes an axial drive mechanism, which rotates the radiation guide together with the wafer.

Preferably, the radiation guide is fixedly mounted in the wafer support assembly so as to rotate therewith.

Alternatively, the thermal radiation is substantially non-coherent.

There is further provided, in accordance with a preferred embodiment of the present invention, a method for thermal processing of an object, including:

heating the object;

bringing a thermal radiation collector into proximity with a selected region of the object;

shielding the radiation collector from radiation other than radiation from the region;

collecting thermal radiation from the region using the radiation collector; and determining a temperature of the region responsive to the collected thermal radiation, whereby the processing is controlled responsive to the determined temperature.

Preferably, shielding the radiation collector includes cooling a structure in a vicinity of the object and the collector to a temperature substantially below the temperature of the region of the object.

Preferably, cooling the structure includes cooling a portion of the radiation collector in thermal communication with the structure.

Preferably, shielding the radiation collector includes supporting the object in such a manner as to shield an entrance to the radiation collector.

Preferably, bringing the radiation collector into proximity with the region includes forming a substantially closed cavity adjacent to the object and collecting radiation includes collecting radiation from within the cavity.

Alternatively, the method includes varying a position of the region and concomitantly varying a position of the radiation collector.

Preferably, varying the position of the region includes rotating the object, and varying the position of the radiation collector includes rotating the collector together with the wafer.

Preferably, collecting the radiation includes coupling a fixed radiation collector to the rotating collector in mutual axial alignment so as to enable radiation transfer therebetween, responsive to which the temperature is determined.

Preferably, the radiation is transferred between the fixed and rotating collectors substantially without optical elements intervening therebetween.

Preferably, determining the temperature includes determining a temperature of the region without prior knowledge of an emissivity thereof.

Alternatively, determining the temperature includes transmitting radiation to the region and measuring a reflectance of the region responsive to the transmitted radiation, so as to estimate the emissivity of the region.

There is further provided, in accordance with a preferred embodiment of the present invention, semiconductor processing apparatus, including:

a chamber, into which a semiconductor wafer is introduced for processing thereof;

a heater, which heats the wafer in the chamber;

a radiation guide, which collects thermal radiation from a predetermined region of the wafer;

a wafer support assembly, which supports the wafer, at least a portion of which assembly in proximity to the region and the radiation guide is cooled to a temperature substantially below a temperature of the region; and a pyrometer, which is coupled to receive the radiation from the guide, and which analyzes the radiation to determine the temperature of the region, for use in controlling the processing.

There is further provided, in accordance with a preferred embodiment of the present invention, a method for thermal processing of a region of an object, including:

heating the region;

bringing a thermal radiation collector into proximity with the region;

cooling a structure in proximity to the region of the object and to the radiation collector to a temperature substantially below a temperature of the region of the object;

collecting thermal radiation from the region of the object using the radiation collector; and determining the temperature of the region of the object responsive to the collected thermal radiation, whereby the processing is controlled responsive to the determined temperature.

The present invention will be more fully understood from the following detailed description of the preferred embodiments thereof, taken together with the drawings in which:

DETAILED DESCRIPTION OF PREFERRED EMBODIMENTS

Figure 1A:
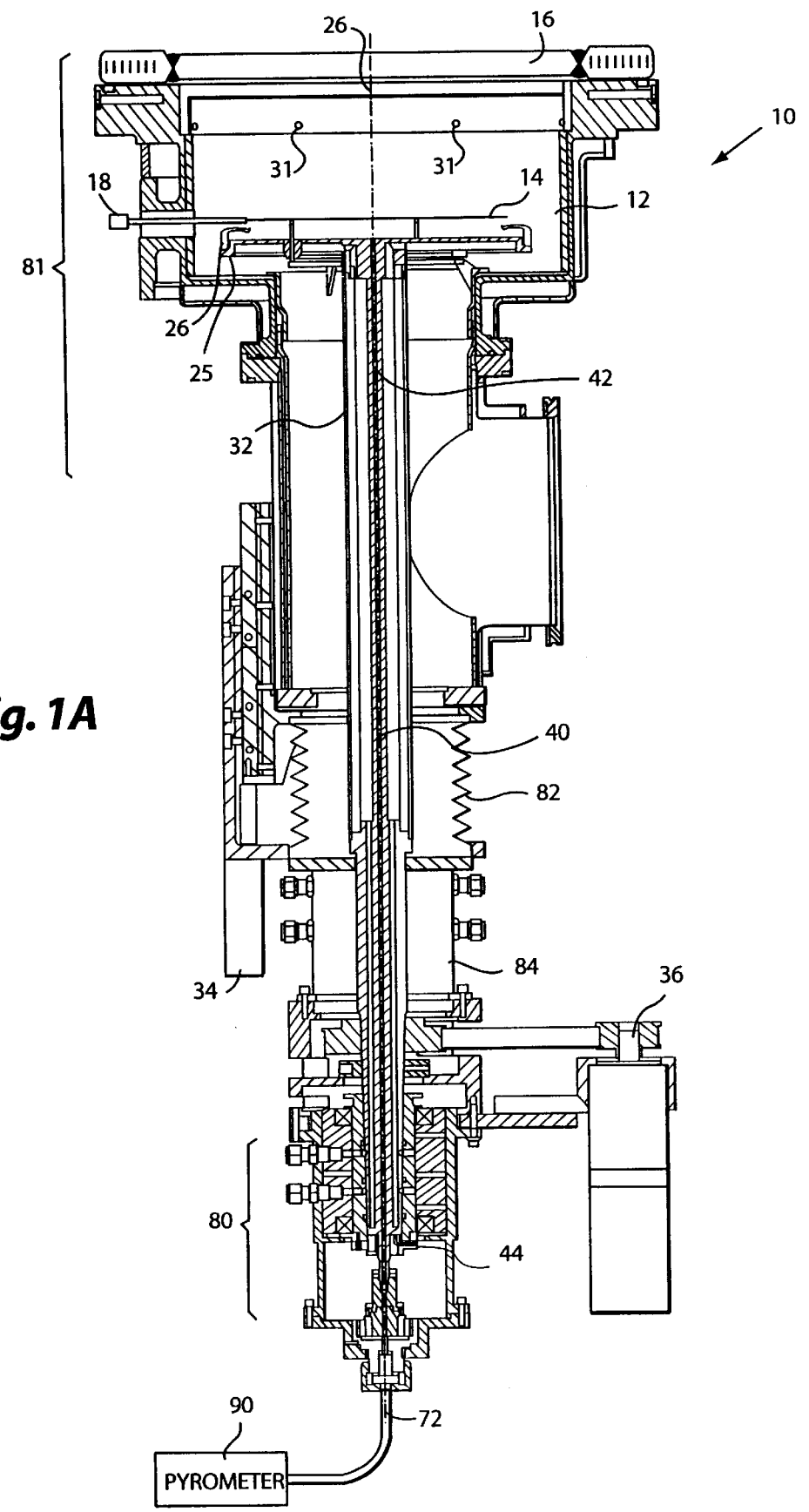
FIG. 1A is a schematic, sectional drawing illustrating thermal processing apparatus, in accordance with a preferred embodiment of the present invention.
Figure 1B:
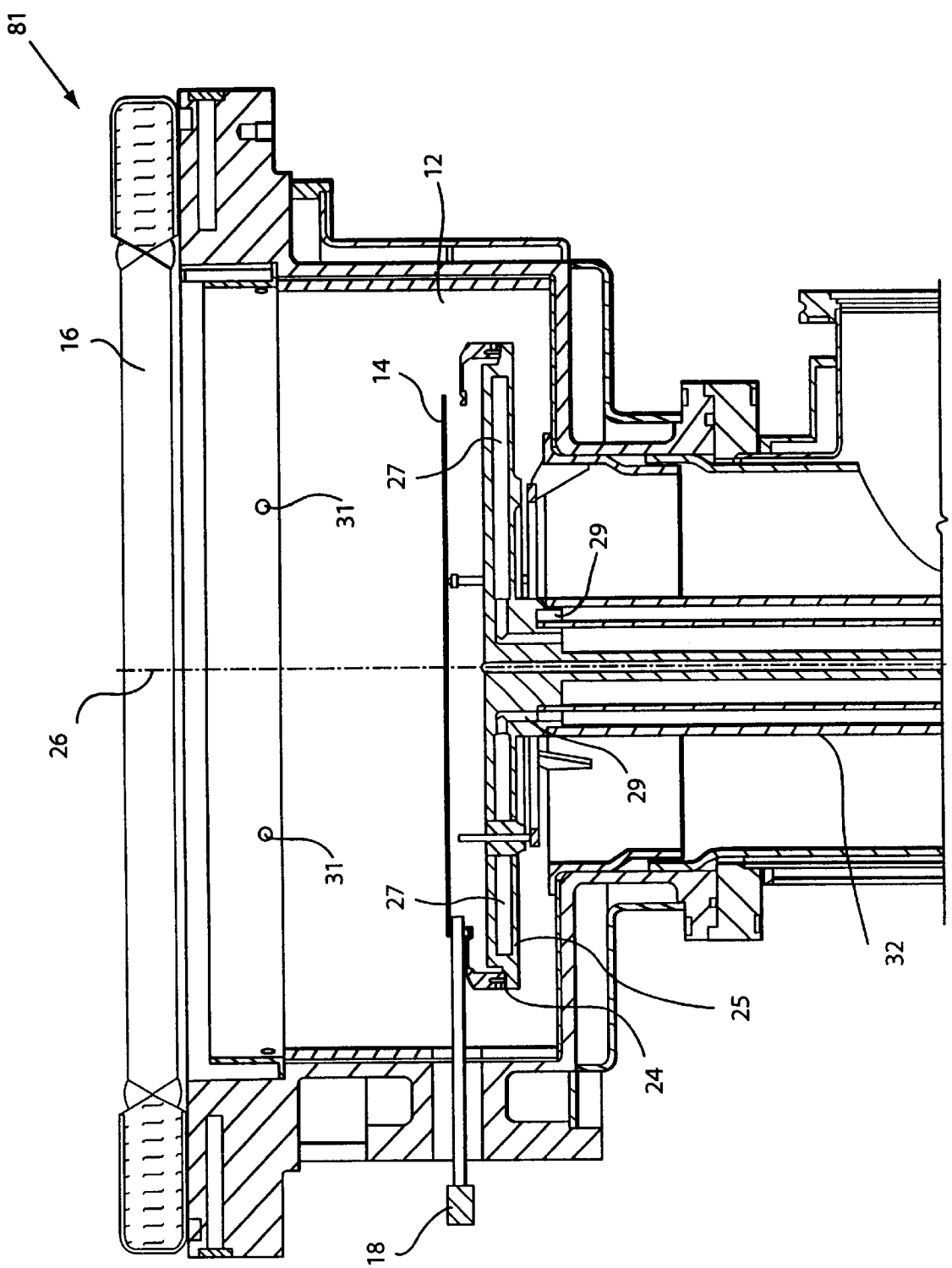
FIG. 1B is an enlargement showing details of an upper portion of the apparatus of FIG. 1A.

Reference is now made to FIG. 1A, which is a schematic, sectional drawing illustrating thermal processing apparatus 10, and to FIG. 1B, which is an enlargement of an upper portion 81 of FIG. 1A, in accordance with a preferred embodiment of the present invention. Apparatus 10 comprises an evacuable process chamber 12, wherein a wafer 14 to be processed is placed by a robot arm 18. For example, process chamber 12 may be generally similar to that provided in the thermal processing apparatus "IntegraPro," manufactured by AG Associates (Israel) Ltd., of Migdal Ha'Emek, Israel. Wafer 14 is processed by being heated in chamber 12 for one or more predetermined times to one or more predetermined temperatures in the presence of one or more selected gases. For example, wafer 14 may comprise a polysilicon wafer heated to 625° C. for 60 s in the presence of silane at 10 torr. Wafer 14 is most preferably heated by radiant heaters (not shown) irradiating the wafer via a radiation-transparent window 16. Typically, the one or more of the gases introduced into chamber 12 cause chemical alteration of a surface of wafer 14 by chemical vapor deposition (CVD) thereon.

A pyrometer 90 is radiatively coupled to chamber 12 and is used to measure a temperature of wafer 14, as described in detail hereinbelow. Preferably, prior or subsequent to wafer 14 being placed in chamber 12, a plurality of test wafers having different, known reflectivities are sequentially placed by robot arm 18 in chamber 12, without opening the chamber. Most preferably, the wafers having known reflectivities are maintained at room temperature within chamber 12. The wafers are used for the purpose of calibrating pyrometer 90, so that the pyrometer is capable of measuring the temperature of wafer 14 without advance knowledge of the wafer emissivity.

A wafer support assembly 24, which is substantially axially symmetric about a vertical axis 26, is disposed within chamber 12 in order to receive and retain wafer 14. Wafer support assembly 24 is carried at the upper end of a vertical shaft 32, which is driven in a vertical direction by a vertical drive 34, and in a rotary direction by a rotary drive 36. The vertical motion of shaft 32, and of a lower section 80 of apparatus 10 to which shaft 32 is coupled, is accommodated by a bellows 82. Thus shaft 32 is able to rotate within apparatus 10 while an outer housing 84 of apparatus 10 remains stationary. However, vertical drive 34 acts on both shaft 32 and outer housing 84, so that both are raised or lowered simultaneously.

A base 25 of assembly 24 has a plurality of passages 27 passing therethrough, which passages are coupled to tubes 29 in shaft 32. Cooling water is transferred via tubes 29 to passages 27, in order to maintain base 25 at a temperature substantially below that of wafer 14 when the wafer is heated.

Figure 2A:
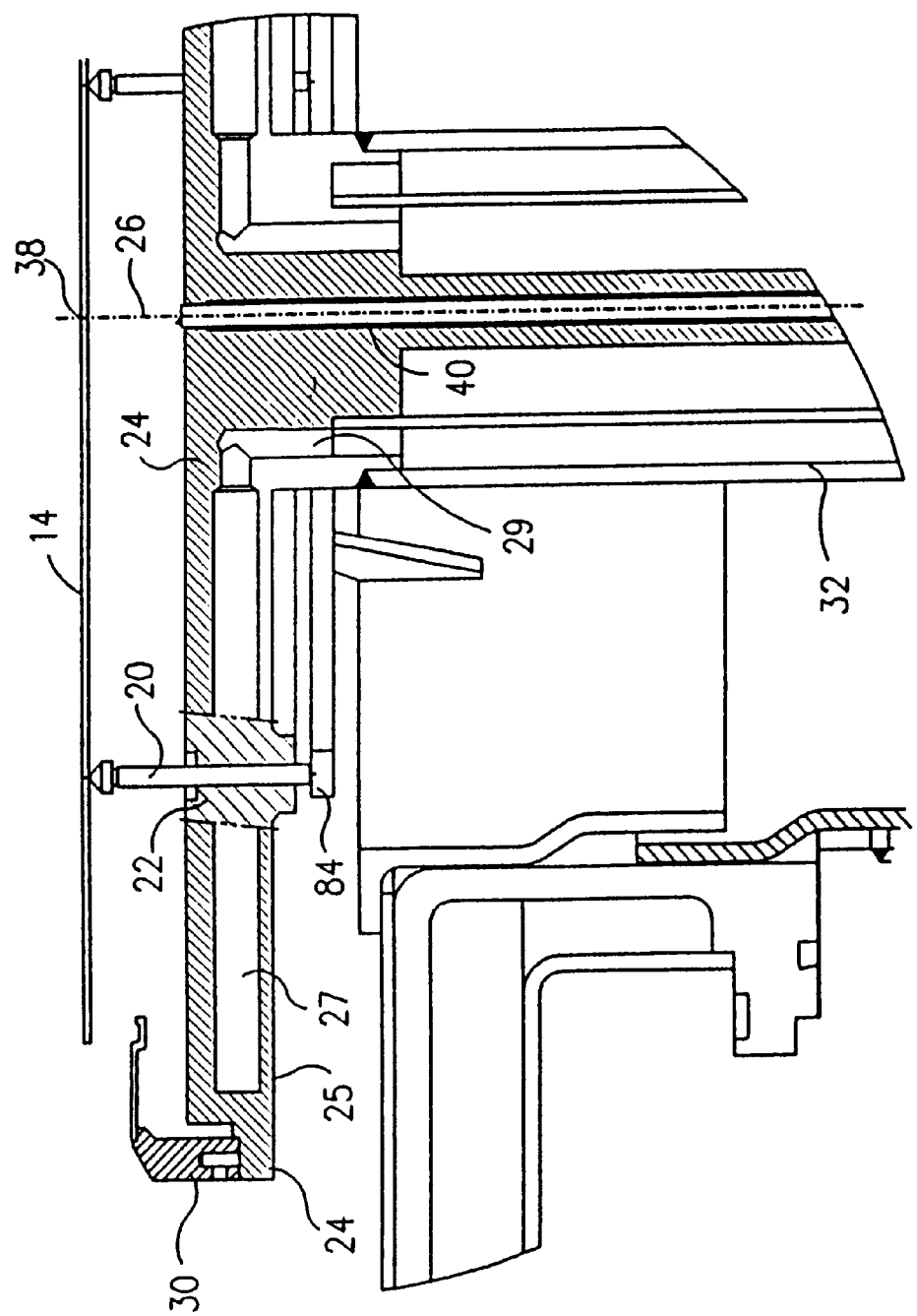
FIG. 2A and FIG. 2B are schematic, sectional diagrams illustrating further details of an upper section of the apparatus of FIG. 1A, and showing a wafer in a loading position and in a processing position, respectively, in accordance with a preferred embodiment of the present invention.
Figure 2B:
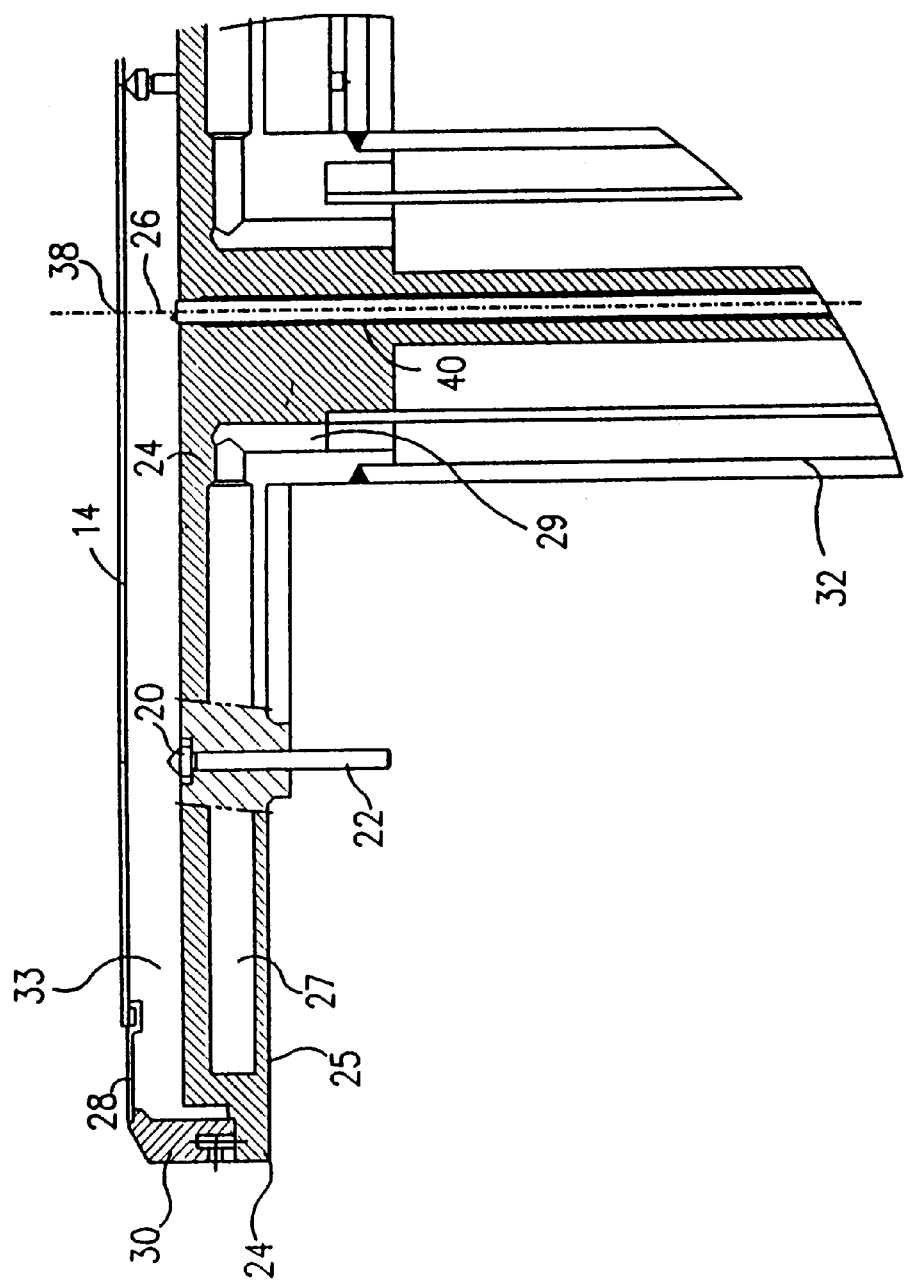

FIG. 2A and FIG. 2B are schematic, sectional diagrams of a portion of process chamber 12, showing wafer 14 in a loading position and in a processing position, respectively, in accordance with a preferred embodiment of the present invention. Wafer support assembly 24 comprises a plurality of supports 20, preferably three supports, which are disposed symmetrically about axis 26 and which are able to move vertically in respective sleeves 22 contained in assembly 24. During loading of wafer 14 into chamber 12, wafer support assembly 24 is positioned in a lowered position (FIG. 2A) by drive 34, so that supports 20 are vertically extended above assembly 24 in order to receive wafer 14 from robot arm 18. Supports 20 are maintained in the extended loading position by a support stop 84, which is preferably in the form of a ring.

Once wafer 14 is in position, wafer support assembly 24 is raised by drive 34, so that supports 20 and wafer 14 move vertically downward relative to assembly 24 due to their own weight. Wafer support assembly 24 comprises an annular slip-free ring 28 and a ring retainer 30 which fixedly and symmetrically holds ring 28 in place relative to base 25. Assembly 24 is raised until wafer 14 contacts ring 28. Raising the head assembly further causes supports 20 to retract into assembly 24 (FIG. 2B). Preferably, ring 28 is constructed from aluminum nitri-decoated graphite or polysilicon in order to provide a slip-free, heat-resisting support for wafer 14. Preferably, base 25, supports 20, and retainer 30 are made of aluminum nitride-coated Inconel or stainless steel. Other materials may also be used, as will be clear to those skilled in the art.

Once assembly 24 is in its raised position, wafer 14 is processed by introduction of gases into thermal contact with wafer 14, and purging of the gases, via ports 31 (FIG. 1B) in chamber 12, as is known in the art. During processing, assembly 24 and wafer 14 are most preferably rotated about axis 26 by means of drive 36, thus varying the position, including the angular orientation, of regions within the wafer over time, in order to enhance the uniformity of the temperature of wafer 14, and in order to enhance the uniformity of chemical deposition thereon.

The temperature of a lower surface 38, substantially centered on axis 26, of wafer 14, is evaluated by measurements made of thermal radiation from the surface as described hereinbelow. A radiation guide 40, which is substantially transparent to thermal radiation from region 38, is axially disposed within shaft 32. Guide 40 is most preferably made from quartz or sapphire, and is fixedly connected to shaft 32 so that guide 40 is in good thermal and mechanical contact with base 25, and so that the guide rotates as shaft 32 rotates. Guide 40 preferably has a diameter of the order of 3 mm, and is positioned so that an upper end 42 thereof is of the order of 7–10 mm from lower surface 38, so that thermal radiation from surface 38 is collected by guide 40. Guide 40 transfers thermal radiation from upper end 42 to a lower end 44 of guide 40.

Upper end 42 of guide 40 is shielded from radiation other than that produced by lower surface 38 by being part of a substantially closed cavity 33 defined by wafer 14, base 25, ring 28, and retainer 30. Furthermore, since base 25 is cooled to a temperature substantially below the temperature of surface 38, intrinsic thermal radiation from base 25 and objects in thermal contact with the base will be significantly reduced. Thus, the fraction of radiation received by guide 40, other than radiation from surface 38, is reduced, compared to systems where shielding and/or cooling are not utilized, so that the accuracy of temperature measurements of surface 38 based on the thermal radiation received at lower end 44 of guide 40 is significantly enhanced. Furthermore, unlike systems known in the art, since cavity 33 is not required to act as a black-body cavity, there is no requirement for the cavity to reach thermal equilibrium or for the surface of base 25 to have a particular, known reflectance.

Figure 3:
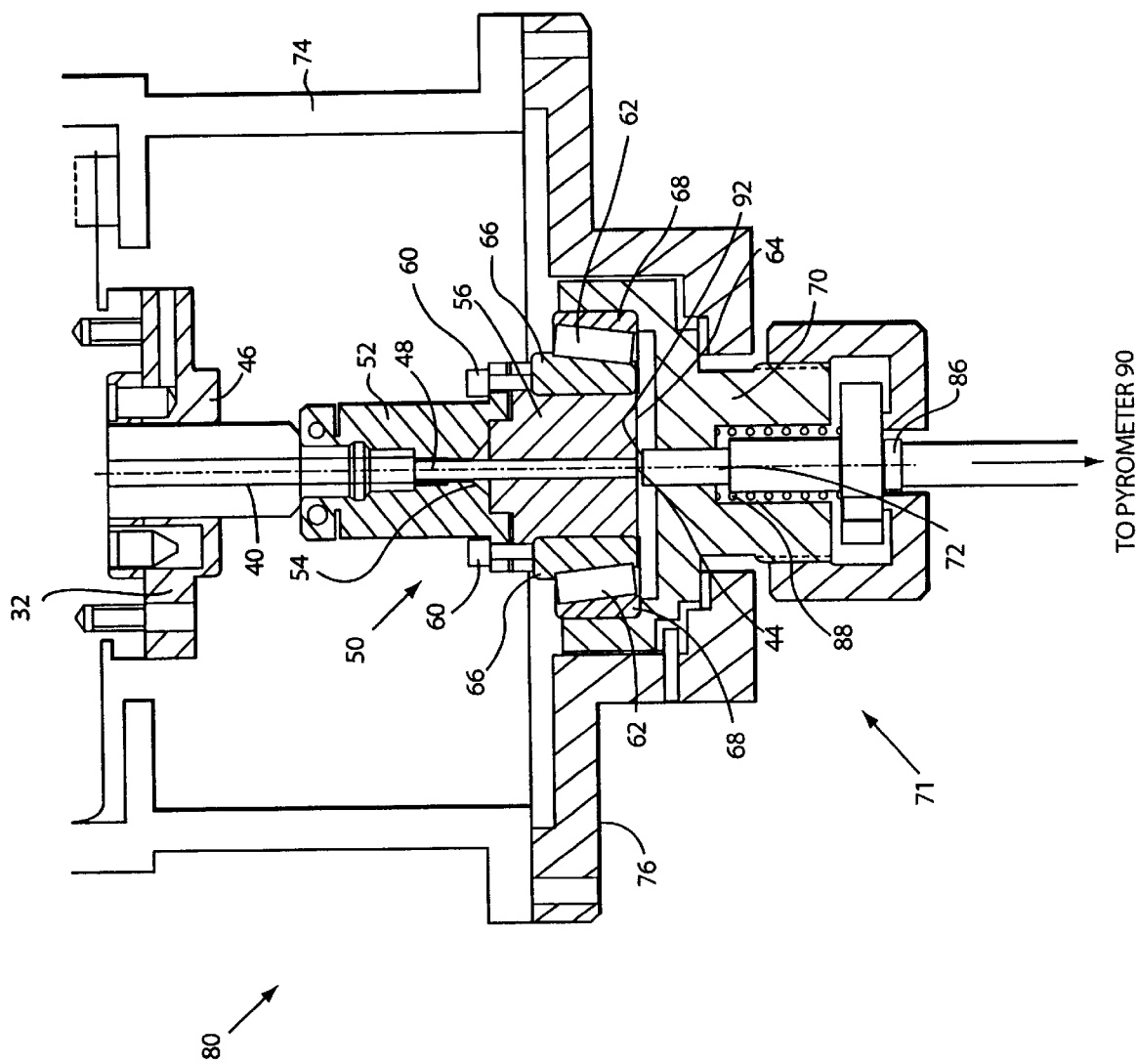
FIG. 3 is a schematic, sectional diagram showing details of a lower section of the apparatus of FIG. 1A, in accordance with a preferred embodiment of the present invention.

FIG. 3 is a schematic, sectional diagram of a lower section of apparatus 10, showing details of coupling of guide 40 to pyrometer 90, in accordance with a preferred embodiment of the present invention. Guide 40 protrudes beneath a lower end 46 of shaft 32, and a lower region 48 of guide 40 is clamped by a guide holding assembly 50. Assembly 50 comprises a guide adapter 52, an O-ring 54, and a guide housing 56, which are all axially symmetric, and through all of which guide 40 passes substantially axially. Holding assembly 50 is fixedly attached to guide 40 by tightening a plurality of screws 60 between adapter 52 and housing 56, in such a way as to compress O-ring 54, so that lower end 44 of guide 40 is substantially aligned with a base 64 of housing 56.

Assembly 50 further comprises a bearing 62, most preferably a tapered roller bearing, for example a 32004X bearing manufactured by SKF Inc. of Gothenburg, Sweden, fixedly connected by an inner ring 66 to an exterior surface of housing 56. An outer ring 68 of bearing 62 is fixedly connected to a pyrometer guide holder 70, wherein is positioned, as described in more detail below, a pyrometer radiation guide 72, an inner section of which is substantially transparent to the thermal radiation from region 38. Holder 70 is connected by a floating mechanism 71and by a coupling bracket 76 to a housing 74, in order to eliminate wobble between guide 40 and guide 72.

Thus, as shaft 32 rotates under the action of drive 36, guide 40 and guide holding assembly 50 also rotate at the same rate, while guide holder 70 and guide 72 remain fixed. As shaft 32 is moved vertically by drive 34, lower section 80, including guide holder 70 and guide 72, moves vertically.

Guide 72 is adjustably fixed within holder 70 by floating mechanism 71, which comprises a split hub clamp 86 and spring 88 and bearing 62, so as to substantially align the axes of guide 72 and guide 40, and so that an upper end 92 of guide 72 is of the order of 0.5 mm from lower end 44 of guide 40. Most preferably, the inner section of guide 72 has a diameter substantially equal to the diameter of guide 40, so that there is substantially no loss of thermal radiation as radiation transfers between guide 40 and guide 72. Guide 72 is most preferably flexible, so that pyrometer 90 connected to a lower end of guide 72 may remain fixed during any vertical motion of guide holder 70. For example, guide 72 comprises an EX524 optical conduit manufactured by Dolan-Jenner Industries Inc. of Lawrence, Mass., which has an external diameter of about 5 mm.

Guide 72 transfers thermal radiation received from guide 40 to pyrometer 90, which evaluates the radiation in order to determine a value of the temperature of region 38. The guides may also be used to transfer radiation from the pyrometer to wafer 14, so as to measure reflection of the radiation from the wafer, in addition to thermal emission therefrom. Preferably, pyrometer 90 is able to evaluate the temperature of region 38 without prior knowledge of an emissivity of the region. Thus, unlike semiconductor processing chambers known in the art, apparatus 10 enables wafer 14 to be processed based on the temperature measured in a specific, predetermined region of the wafer, without the necessity of equilibrating the temperature or enclosing the wafer so as to bring the emissivity to an effective value close to 1. Consequently, wafer processing, particularly RTCVD-type processing, in apparatus 10 proceeds with greater speed and more accurate control of processing parameters than in currently-available systems.

Preferably, pyrometer 90 irradiates region 38 with a radiant source generating a radiation of a known wavelength and energy, and evaluates the temperature of the region responsive to reflected and intrinsic radiation from the region. Such pyrometers are described, for example, in the patent by Moslehi et al., and in the article by Glazman, et al., cited in the Background of the Invention. The pyrometer both transfers the irradiating radiation from guide 72 to guide 40, and thence to region 38, and receives the reflected and intrinsic radiation back through guide 40 and guide 72. Alternatively, pyrometer 90 is able to evaluate the temperature of region 38 when an effective emissivity of the region is known, for example, by methods of calibration known in the art. Preferably, the temperature evaluated by pyrometer 90 is used as a parameter in a closed-loop control system used to maintain the temperature of wafer 14 at a predetermined value, by methods known in the art.

Although the preferred embodiment described hereinabove illustrates a certain configuration of processing apparatus 10, those skilled in the art will appreciate that the principles of the present invention may be applied in a wide range of processing systems. Such systems may employ some or all of the elements of the present invention in different combinations and configurations. For example, the methods of shielding a radiation guide from extraneous radiation when transferring radiation for measuring the temperature of a wafer, and/or cooling regions close to the wafer to a temperature substantially below the temperature of the wafer, thereby increasing the accuracy of the temperature measurement, will be useful in many different processing contexts. All such alternative combinations, configurations and applications are considered to within the scope of the present invention.

It will thus be appreciated that the preferred embodiment described above is cited by way of example, and the full scope of the invention is limited only by the claims.

What is claimed is:

1. Semiconductor processing apparatus, comprising:
   a chamber, into which a semiconductor wafer is introduced for processing thereof;
   a heater, which heats the wafer in the chamber;
   a radiation guide, which collects thermal radiation from a selected region of the wafer;
   a wafer support assembly, which supports the wafer and shields the radiation guide from radiation other than radiation from the region and which varies the position of the wafer and varies the position of the radiation guide in cooperation therewith; and
   a pyrometer, coupled to receive the radiation from the guide, and which analyzes the radiation to determine a temperature of the region, for use in controlling the processing.

2. Apparatus according to claim 1, wherein at least a portion of the wafer support assembly is cooled to a temperature substantially below the temperature of the region.

3. Apparatus according to claim 2, wherein a portion of the radiation guide in proximity to the wafer is in thermal communication with the cooled portion of the wafer support assembly.

4. Apparatus according to claim 1, wherein the wafer and the wafer support assembly form a cavity that is substantially closed against entry of extraneous radiation.

5. Apparatus according to claim 1, and comprising a fixed radiation guide, which is coupled to the variably positioned radiation guide so as to transfer the radiation between the guide and the pyrometer.

6. Apparatus according to claim 5, and comprising a connector coupling the fixed guide to the variably positioned guide in mutual axial alignment so as to enable radiation transfer therebetween.

7. Apparatus according to claim 5, wherein the radiation is transferred between the fixed and variably positioned guides substantially without optical elements intervening between the guides.

8. Apparatus according to claim 7, wherein the variably positioned guide rotates about a longitudinal axis common to the fixed and variably positioned guides.

9. Apparatus according to claim 1, wherein the pyrometer determines the temperature of the region substantially without prior knowledge of an emissivity of the region.

10. Apparatus according to claim 9, wherein the pyrometer transmits radiation into the guide and measures a reflectance of the wafer responsive to the transmitted radiation, so as to estimate the emissivity of the wafer.

11. Apparatus according to claim 1, wherein the assembly comprises a vertical drive mechanism, which drives the radiation guide to a position in proximity with the wafer.

12. Semiconductor processing apparatus, comprising:
    a chamber, into which a semiconductor wafer is introduced for processing thereof;
    a heater, which heats the wafer in the chamber;
    a radiation guide, which collects thermal radiation from a selected region of the wafer;
    a wafer support assembly, which supports the wafer and shields the radiation guide from radiation other than radiation from the region, and which comprises an axial drive mechanism, which rotates the radiation guide together with the wafer; and
    a pyrometer, coupled to receive the radiation from the guide, and which analyzes the radiation to determine a temperature of the region, for use in controlling the processing.

13. Apparatus according to claim 12, wherein the radiation guide is fixedly mounted in the wafer support assembly so as to rotate therewith.

14. Apparatus according to claim 1, wherein the thermal radiation is substantially non-coherent.

* * * * *